United States Patent [19]

Ziarati

[11] Patent Number: 5,412,419
[45] Date of Patent: May 2, 1995

[54] MAGNETIC RESONANCE IMAGING COMPATIBLE AUDIO AND VIDEO SYSTEM

[75] Inventor: Mokhtar Ziarati, Calabasas, Calif.

[73] Assignee: Susana Ziarati, North Hollywood, Calif.

[21] Appl. No.: 653,711

[22] Filed: Feb. 11, 1991

[51] Int. Cl.$^6$ .............................................. H04N 7/18
[52] U.S. Cl. ....................................... 348/61; 348/77; 324/318; 128/653.2
[58] Field of Search ................. 358/93, 901, 102, 110, 358/112; H04N 7/18; 128/653 R, 653 A, 653 AF, 653 CA, 653 SC; 381/94, 88, 90, 154, 159; 348/61, 77, 162

[56] References Cited

U.S. PATENT DOCUMENTS

| | | | |
|---|---|---|---|
| 4,347,911 | 9/1982 | Bertagna et al. | 181/130 |
| 4,595,260 | 6/1986 | Kubota | 350/351 |
| 4,824,210 | 4/1989 | Shimazaki | 350/331 R |
| 4,861,142 | 8/1989 | Tanaka et al. | 350/345 |
| 4,901,141 | 2/1990 | Costello | 128/653 A |
| 4,903,703 | 2/1990 | Igarashi et al. | 128/653 A |
| 4,928,123 | 5/1990 | Takafuji | 353/20 |
| 4,933,981 | 6/1990 | Lederer | 381/90 |
| 4,981,137 | 1/1991 | Kondo et al. | 128/653 A |
| 4,991,580 | 2/1991 | Moore | 128/653 SC |
| 4,991,587 | 2/1991 | Blakeley et al. | 128/653 A |
| 5,076,275 | 12/1991 | Bechor et al. | 128/653.2 |

FOREIGN PATENT DOCUMENTS

3708518  9/1988  Germany .............................. 128/653

OTHER PUBLICATIONS

AAPM report No. 20, "Site planning for Magnetic Resonance Imaging Systems," published in 1986 by the American Association of Physicists in Medicine.

*Primary Examiner*—Victor R. Kostak
*Assistant Examiner*—Michael H. Lee
*Attorney, Agent, or Firm*—Wilson, Sonsini, Goodrich & Rosati

[57] ABSTRACT

An audio and video system that is compatible with the strong magnetic fields generated by Magnetic Resonance Imaging equipment (wherein the MRI equipment is separated by a penetration panel into a control room and a magnet room). The system receives an incoming RF signal through a television or video cassette recorder, and then separates the RF signal into a video section signal and an audio section signal. The video section signal passes through appropriate buffering, amplifying, low pass (for the procession frequency) and RF filtering circuits, and is next conducted through the penetration panel into the magnet room where it is terminated and filtered again for spurious noise. A processor and LCD pixel driver then process the video section signal and send it to an LCD display screen. A mushroom shaped hook is mounted to the screen and a catch is mounted to a bore of a main magnet inside the magnet room so that the LCD screen can be attached to the bore. The audio section signal is separated into two channels, passed through an amplifier and appropriate RF filters and chokes, and fed into a pneumatic transducer inside the magnet room. A headset having an inner set connects the output of the pneumatic transducer to the patient's ear, while an outer set covers the patient's ear to block out gradient knocking noises. In an alternate embodiment, a CCD camera is mounted inside the control room along with a microphone so that pictures and sounds from the MRI technologist can be broadcast through the present system to allow the patient to see and hear the technologist speaking. Fiber optics technology may also be incorporated into the signal conducted cables provided under this invention.

46 Claims, 3 Drawing Sheets

MAGNETIC RESONANCE IMAGING COMPATIBLE AUDIO AND VIDEO SYSTEM

BACKGROUND OF THE INVENTION

1. Field of the Invention

The present invention relates to the field of magnetic resonance imaging equipment. More precisely, the present invention relates to an audio and video system including a liquid crystal display that is not disrupted by strong magnetic fields created by Magnetic Resonance Imaging devices.

2. Description of the Prior Art and Related Information

Magnetic Resonance Imaging (i.e., "MRI") is a relatively new scanning procedure being used in the medical community extensively. MRI is a valued technique for assisting doctors diagnose numerous medical ailments. The scanning procedure requires that a patient lie still inside a tunnel shaped enclosure called the bore. The MRI device uses a strong magnetic field that is generated around the patient's body. Disturbances in the field due to the presence of the body can be detected and translated into images displayed on a viewing screen.

MRI technology involves very sophisticated hardware. The most prominent piece of hardware is a large magnet that induces a strong, uniform, and static magnetic field. Generally, the magnetic field ranges from 0.5 Tesla to 2.0 Tesla inside the bore. Gradient coils disposed around the bore induce spatially variant magnetic fields (i.e., gradients) that modify the existing uniform magnetic field. To induce nuclear resonance, a transmitter emits radio waves through a coil, which coil couples the radio wave energy with the resonating nuclei inside the magnetic field. A receiver, also connected to the coil, receives the disrupted electromagnetic waves. The waves are filtered, amplified, and processed into visual data for viewing by an MRI technologist attending to the procedure. More detailed information regarding MRI equipment is available in a book entitled *Nuclear Magnetic Resonance*, pp. 53–66 (1st ed. 1981), the contents of which are incorporated by reference.

As useful as an MRI scanning procedure is, it exacts a toll on the patient. For example, on many occasions patients cannot complete the exam due to claustrophobia caused by having to lie prone inside the bore for a long time while the procedure takes place. To be sure, the procedure is rather long in duration, lasting about half an hour up to two hours. Or, the patient simply gets bored or restless from being in a tight area.

Another discomforting factor is that during the MRI exam there is a harsh and loud knocking noise generated by the MRI gradient amplifier. This noise is commonly called gradient pulse, which naturally is very annoying to the patient who must endure the drone for a long period of time.

Accordingly, there is a great demand for some method of comforting the patient to keep his mind off the MRI scanning procedure. He should be entertained in some way without having the entertainment aspect detracting from the quality of the images that are being taken by the MRI technologist. Indeed, the patient should be relaxed somehow since the MRI device is formidable-looking and the patient is most likely already nervous from having to undergo such an examination.

A quick and simple solution to the entertainment problem is to provide the patient with a television to view, or a radio to listen to. But by virtue of the operating principles behind MRI technology, the exam room where the main magnet is located is permeated with very strong magnetic fields. So it is nearly impossible for a typical television, video cassette recorder (VCR), stereo, cassette player, or any electronic device to function properly in those conditions. In short, the effect of the strong magnetic field and the sensitivity of the MRI hardware to high frequency RF leakage (mainly from 10 MHz to 70 MHz) do not allow an ordinary television or audio system to function inside the magnet room (i.e., exam room).

Therefore, a need presently exists for an electronic device that can operate in the environment of an MRI magnet room to entertain a nervous patient while he or she undergoes the scanning procedure. The electronic device should also not interfere with the MRI process.

SUMMARY OF THE INVENTION

The present invention relates to an electronic entertainment device suitable for operation within strong magnetic fields. In a preferred embodiment, the present invention provides an audio and video system with properly filtered and shielded circuitry so that the system can be operated in a strong magnetic field created by MRI equipment. For the patient's benefit, the system also provides a liquid crystal display (LCD) screen for watching and a headset for listening.

The audio and video system provided by the present invention is divided between two rooms occupied by the MRI equipment. Although not part of the present invention, description of the rooms is given as background information. One room is called the control room and is where the MRI technologist controls the MRI process. The other room is the magnet or exam room, which is separated from the control room by a penetration panel, and contains the main magnet of the MRI device.

According to the present invention, the system receives an incoming RF signal through a television receiver or video cassette recorder, which then separates the RF signal into a video section signal and an audio section signal. The video section signal passes through appropriate buffering, amplifying, low pass and RF filtering circuits. The low pass filter is necessary to block out high frequency noise around the procession frequency of a hydrogen proton, which resonates during the MRI process. Next, the video section signal is conducted through the penetration panel into the magnet room where it is terminated and filtered again for noise.

Inside the magnet room, a processing circuit and LCD pixel driver then process the video section signal and send it to an LCD display screen. An optional magnifying lens system may be adapted to the LCD display screen to project the pictures on to a large reflective screen (as in a big screen TV). A patient lying prone inside the magnet bore can then watch the television pictures on the reflective screen through a pair of prism glasses worn by him.

But without the lens system, the patient views the LCD display screen directly. To facilitate viewing, a mushroom shaped hook is mounted to the LCD screen and a catch is mounted to the bore so that the LCD screen can be attached to the bore.

The audio section signal is separated into two channels, passed through an amplifier and appropriate RF filters and chokes, and fed through the penetration panel and into a pneumatic transducer inside the magnet room. The pneumatic transducer converts the electrical impulses of the audio section signal into audible sound waves.

Also provided by the present invention is a headset designed to fit the skull of the patient undergoing the MRI procedure. The headset comprises an inner set and an outer set. The inner set connects the output of the pneumatic transducer to the patient's ear, thereby bringing sounds of the television or VCR to the patient. By contrast, the outer set is circumaurel in construction so that each ear cup covers the patient's ears to block out gradient knocking noises.

Another feature of the preferred embodiment system is for the patient to be able to see and hear the MRI technologist speaking to him from the control room via the LCD display screen and headset. This is achieved by mounting a CCD (charge coupled device) camera with a microphone in the control room and using a television signal interrupt switch to turn the CCD camera and microphone on, and then patching into the television receiver. The receiver then functions as before to direct the pictures and sounds to the patient. Hence, this feature allows the patient to see and hear the technologist.

DETAILED DESCRIPTION OF THE INVENTION

The following detailed description outlines an MRI compatible audio and video system having an LCD display screen. In the following description, numerous details such as specific materials and configurations are set forth in order to provide a more complete understanding of the present invention. But it is understood by those skilled in the art that the present invention can be practiced without these specific details. In other instances, well known elements are not described in detail so as not to obscure the present invention. In any event, the scope of the invention is best determined by reference to the appended claims.

GENERAL ARRANGEMENT

Figure 1:
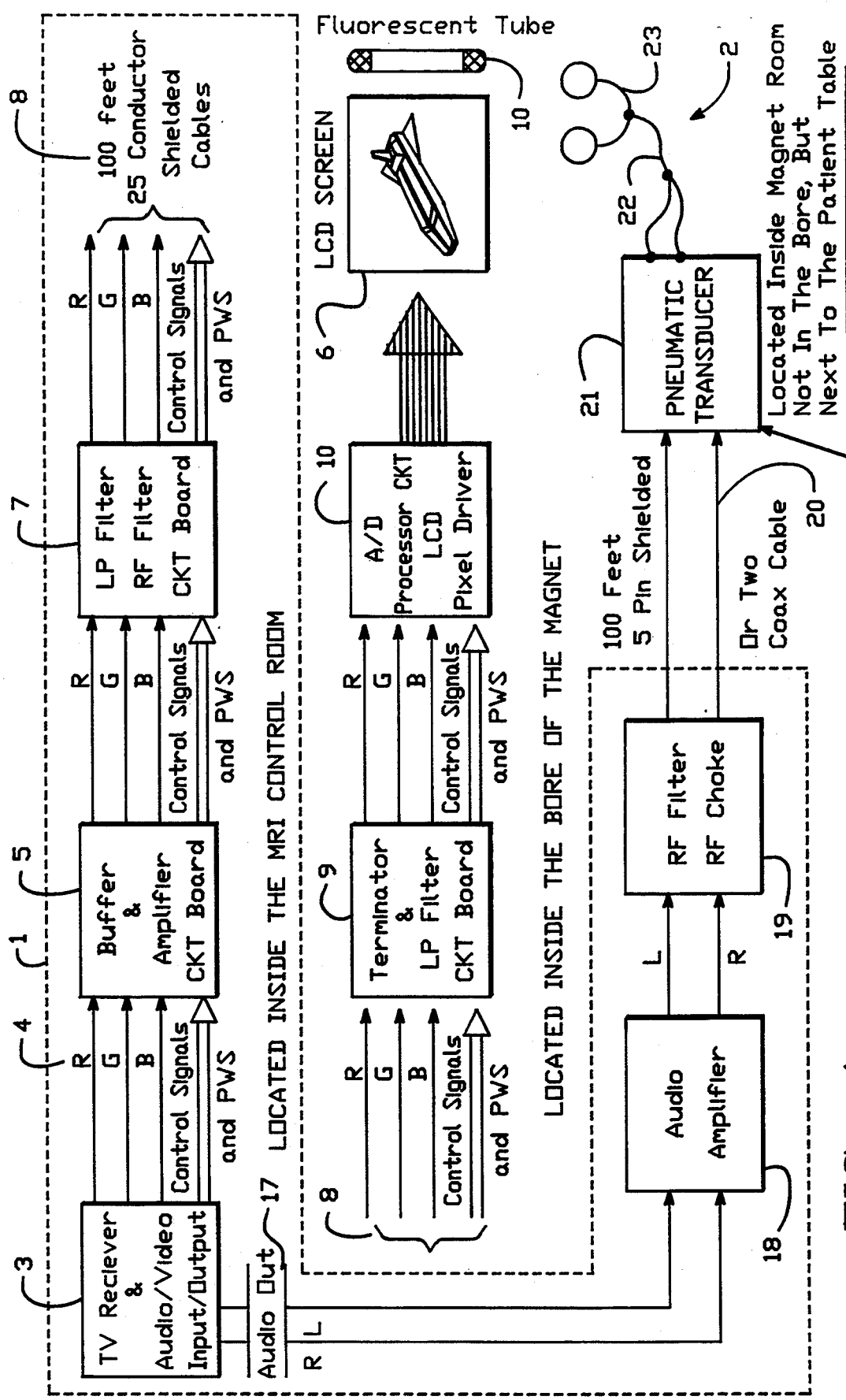
FIG. 1 is a block diagram of a preferred embodiment of the present invention illustrating the entire audio and video system separated between a control room and a magnet room.

In a preferred embodiment, the present invention provides an MRI compatible audio and video system. FIG. 1 gives a general overview of how the present invention system is set up in relation to the MRI equipment, which is disposed partly in a magnet room and partly in a control room.

One portion of the present invention system is located inside the MRI control room 1. That portion of the system includes a receiver and associated electronic filters and circuitry. Dashed lines in FIG. 1 circumscribe the borders of that room. Everything outside the dashed lines represents the examination or magnet room 2. The other portion of the system that includes an LCD screen and its circuitry are located within the magnet room 2. As the name implies, the magnet room 2 contains a main magnet of the MRI device (not shown) that generates a strong magnetic field.

Continuing with the general overview, FIG. 1 shows that the system contained in the magnet room 2 is again divided such that certain parts of the system are mounted inside the bore of the main magnet (so labeled in FIG. 1) and other parts remain outside the bore. The parts inside the bore include a terminator, filter circuits, an LCD pixel driver, and an LCD screen. Of course the patient (not shown) undergoing the scanning process is positioned inside the bore, too. Outside the bore but still within the magnet room 2 is a pneumatic transducer 21 for generating sound, which is connected to a headset 23 worn by the patient.

Aside from being physically divided into two portions, the system in a preferred embodiment is separated in terms of electronics into two major sections; namely, a video section and an audio section. Each section is explained in detail below.

THE VIDEO SECTION (CONTROL ROOM)

The video section is located partially in the control room 1 and partially in the magnet room 2, as illustrated in FIG. 1. In the control room 1, a television receiver 3 picks up an incoming RF signal through an antenna or from a video source like a video cassette recorder (VCR) player. The receiver 3 processes the incoming RF signal and separates out the sound or audio section signal 17 from the picture or video section signal 4. Since a television receiver and VCR are devices well known in the art, no detailed discussion is required here.

In the video section, the video section signal 4 is processed from the incoming RF signal in the television receiver 3 to obtain red, green, and blue chroma video signals (labeled R, G, and B in FIG. 1), and a control signal. The red, green and blue chroma signals along with the control signal, collectively labeled the video section signal 4, are sent to a buffer board 5. A power supply, well known in the art, delivers as part of the video section signal 4 a power signal (labeled PWS in FIG. 1) to the buffer circuit board 5.

At this point all the signals necessary to drive the LCD display screen 6 are present, but since the LCD screen 6 is located a distance away from the television receiver 3 (in a preferred embodiment, about 100 feet away from the television unit) the video section signal 4 needs to be amplified and buffered. Hence the need for a buffer and amplifier board 5. For some types of signals, only a unity-gain, current driver amplifier is sufficient. In this preferred embodiment, a high gain bandwidth operational amplifier is used as a buffer to drive the video section signal 4 through the approximately 100 feet. In some signals, amplification along with a driver are necessary.

A typical MRI signal is very sensitive to the electrical noise around the procession frequency of a hydrogen proton, wherein this frequency varies from 12 MHz to 80 MHz depending on the field strength of the magnet. This relationship is generally expressed as:

$$f = (42.5) \times (B)$$

wherein B is the field strength in Tesla and f is the frequency in Megahertz.

Mindful of the foregoing relationship, a filter board 7 is included to block out all other frequencies above the video frequency range, typically above 4.5 MHz. To do that, a LP filter and an RF filter are required for the filter board 7. All of the signals from the buffer board 5 have to pass through the filter board 7 before entering the magnet room 2.

As alluded to above, after leaving the filter board 7, the video section signal 4 can travel up about 100 feet before interfacing with the LCD screen 6. Thus, a 25-conductor shielded cable 8 is used to carry the video section signal 4 for that distance.

In an alternate embodiment (not shown), a fiber optic cable may be used in place of the shielded cable 8. Further, a fiber optic generator is added to the filter board 7 to convert the electrical video section signal 4 to optical impulses to be carried by the fiber optic cable. In this embodiment, the terminator board 9 is not required. In its place is a fiber optic receiver to decode and convert the optical impulses into electrical signals.

THE VIDEO SECTION (MAGNET ROOM)

The 25-conductor shielded cable 8 is fed into the magnet room 2 where the other part of the video section is located. But first, the cable 8 must pass through a penetration panel (not shown) separating the magnet room 2 from the control room 1. In the magnet room 2, the incoming video section signal 4 from the 25-conductor shielded cable 8 is terminated with the proper load resistor 9 known in the art. Appropriate filters are also provided on that same circuit board 9 to eliminate the effects of RF signals and gradient noise from the MRI equipment upon the video section signal 4, and vice versa.

Figure 4:
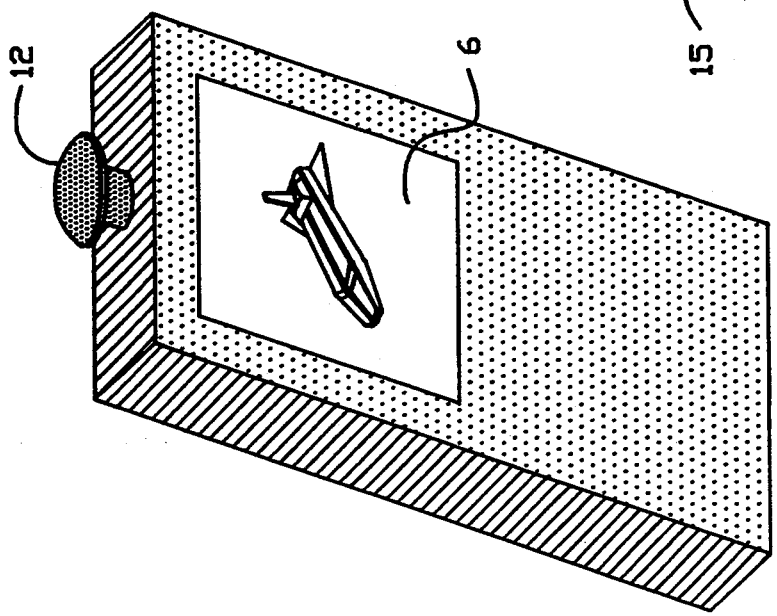
FIG. 4 is a view of a preferred embodiment LCD video display screen.

The video section signal 4 next proceeds to circuit board 10. Here, the incoming analog and digitized signal 4 from the terminator and filter board 9 is processed and fed into an LCD pixel driver circuit 10. The output of the processor circuit and pixel driver 10 is sent to the LCD display screen 6. As seen in FIG. 1, located just behind the LCD display screen 6 is a light source 10 such as a fluorescent tube to supply backlighting for the picture on the LCD screen 6. Naturally, other means of backlighting known in the art are possible. FIG. 4 provides a more detailed view of the LCD display screen 6.

MOUNTING THE LCD DISPLAY SCREEN

According to the present invention, placement of the LCD display screen 6 is important. There are basically two different ways of positioning a patient inside the main magnet bore for an MRI exam; he can be positioned inside the bore either with his head in first or with his feet in first. Needless to say, this complicates the way the LCD display screen 6 can be oriented. For instance, the LCD display screen 6 cannot be mounted in a horizontal plane if the patient goes into the bore feet first because the picture on the LCD display screen 6 would appear upside down to him. Of course the screen 6 would then have to be rotated 180° along a vertical axis of rotation to obtain an upright image.

Fortunately, most of the MRI devices on the market already have a built-in reflection mirror inside the magnet bore. With this mirror, the patient can see outside of the bore along a horizontal axis as he lies on his back on a patient carriage oriented head first in the magnet bore. To take advantage of the orientation of the patient, the present invention provides that the LCD display screen 6 be mounted vertically a quarter of the distance inside the magnet bore. When the patient is placed inside the magnet head first, he can see the LCD display screen 6 through its reflection in the mirror. If the patient enters the magnet bore feet first, he has a direct view of the LCD display screen 6 if the screen 6 is pivoted around a vertical axis.

Figure 5:
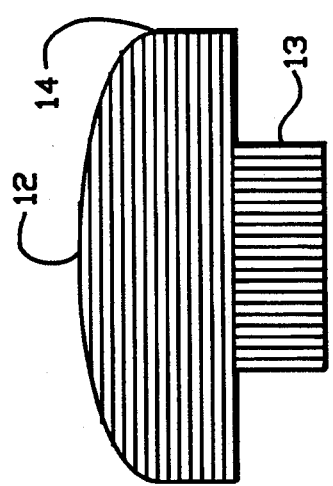
FIG. 5 is an enlarged view of the hook mounted to the LCD display screen.
Figure 6A:
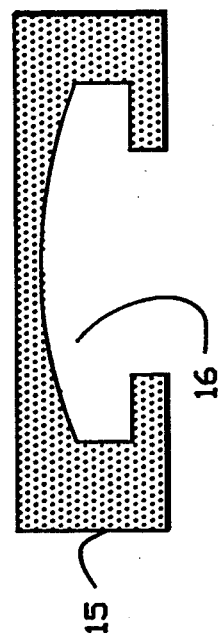

FIGS. 4, 5, 6A and 6B illustrate the means by which the LCD display screen 6 is held in position inside the magnet bore. In this preferred embodiment, a mushroom shaped hook 12 extends from the top of the LCD display screen 6 as depicted in FIG. 4. The display screen 6 in FIG. 4 is tilted slightly to reveal the placement of the hook 12. FIG. 5 shows an enlarged view of the mushroom-shape hook 12. As the name implies, the hook 12 has a round shaft 13 capped at one end by a circular dome 14. A catch 15, shown in FIGS. 6A and 6B, mounted to the bore is designed to receive the hook 12 of the LCD screen 6, holding the screen 6 up in the bore. It can be seen that the large dome 14 of the hook 12 slides into the dovetail opening 16 of the catch 15. Moreover, the hook 12 is designed to rotate, slide or disengage if the LCD display screen 6 is accidentally knocked along a horizontal direction, thus avoiding any damage to the LCD screen 6. Alternatively, the LCD screen 6 can be mounted to the bore with something as simple as a hook and pile fastener (i.e., Velcro).

THE AUDIO SECTION

The next part of the system as provided in the preferred embodiment of the present invention is an audio section that enables the patient to hear the signal from the television receiver 3. Going back to FIG. 1, the television receiver 3 separates out the audio section signal 17 from the received RF signal in a manner known in the art. Next, the audio output from the receiver 3 is separated into two channels for left and right stereo imaging (labeled L and R in FIG. 1), then amplified through a dedicated audio amplifier 18 with a volume control.

The output of the audio section signal 17 from the audio amplifier 18 needs to be filtered to block out electromagnetic interference having a frequency above 20 kHz. Therefore, the present invention provides an appropriate RF filter and RF choke 19 to block out the unwanted electrical noise, obtaining approximately −50 dbA attenuation for all frequencies above 5 MHz. The outputted audio section signal 17 is then conducted into the magnet room 2 through an audio cable 20 that passes through the penetration panel. In a preferred embodiment, the audio cable 20 can be about 100 feet in length of either a five-pin shielded conductor, or two separate coaxial cables. Optical fiber technology may also be incorporated herein to conduct the audio section signal 17 too.

The magnet room 2 where the patients undergo the MRI procedure is completely shielded for RF signals. As mentioned above, the magnet room 2 features a penetration panel that helps shield out unwanted RF signals. Any cable that goes into the magnet room 2 must pass through the penetration panel. As a result, all of the audio and video signals have to be RF shielded and passed through a low pass filter before going through the penetration panel and into the magnet room 2.

Inside the magnet room 2, the audio cable 20 is connected to a box containing a pneumatic transducer 21 to convert electrical impulses of the audio section signal 17 into audible sound waves (i.e., pneumatic impulses). The pneumatic transducer 21 can be made in several different ways. In the preferred embodiment, piezoelectric speakers known in the art are ideal since they utilize the piezoelectric effect and are non-magnetic. Thus, the function of the speaker is not affected by the main magnet.

The sound waves generated by the transducer 21 are conveyed through a hollow tube 22 connected at one end to a headset 23 worn by the patient. In the preferred embodiment, the tubing 22 is made from a flexible polymer material, has a ⅛th inch inside diameter, and extends about 36 inches long. Clearly, there are many other possible methods known in the art of conducting audible sound from the transducer to the headset, of which plastic tubing is only one.

Another acceptable pneumatic transducer is a small, full-range speaker packaged in a manner such that its cone driver faces and abuts the plastic tubing to transfer the sound to the headset. Yet another type of pneumatic transducer is a 4" mid-range driver, model LM1824, manufactured by Electro Voice. This type of driver is configured into a horn where the sound is emitted out of a one-inch diameter opening. The opening can be adapted to a one-half inch diameter plastic tubing which conducts the sound waves to the patient. With this specific horn speaker design, however, the speaker has to be mounted outside of the magnet room because this particular horn driver has a large magnet that might be disrupted by the main magnet of the MRI imager.

THE HEADSET

The audible sound waves from the pneumatic transducer 21 propagate through the hollow tube 22 and into a headset 23. As mentioned above, during the MRI procedure, data is usually collected by a high current RF signal called a gradient pulse. Gradient pulse causes an audible and loud knocking noise that tends to be very annoying to the patient. To overcome this problem, the present invention provides a specially designed headset 23 to block the gradient noise by 21 decibels or approximately 92% attenuation from its original level.

Figure 2:
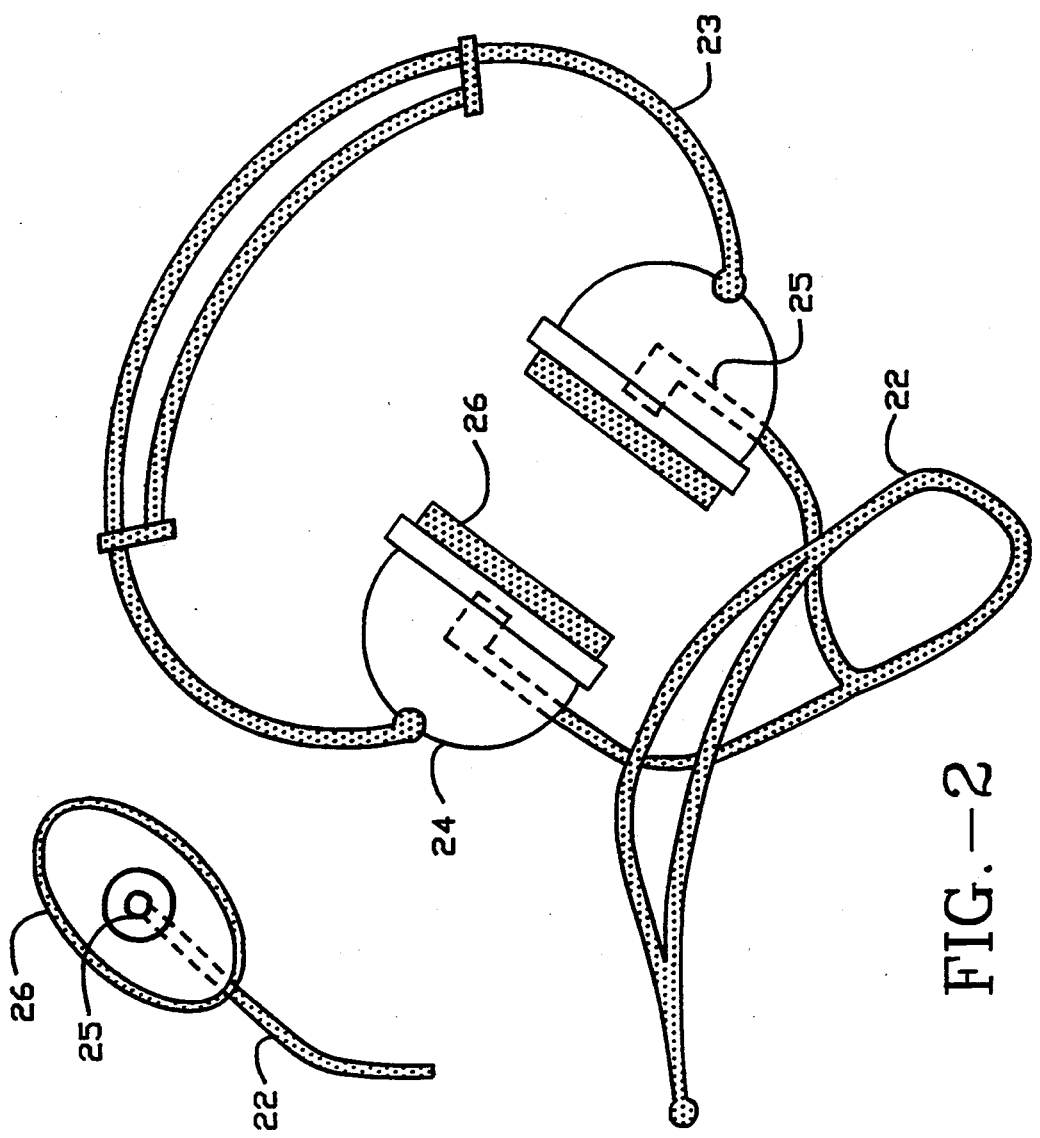
FIG. 2 illustrates a headset provided by the present invention and a supplemental side view of an ear cup of the headset.
Figure 6B:
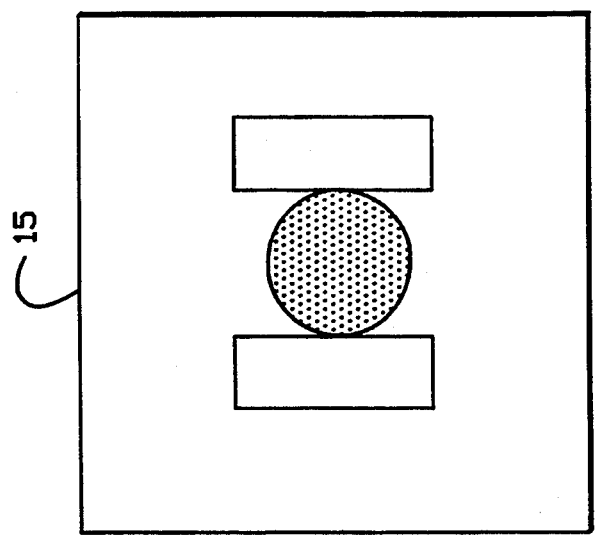
FIGS. 6A and 6B provide side and bottom views, respectively, of the catch mechanism designed to engage the hook shown in FIG. 5.

According to the present invention, the diagram in FIG. 2 shows a preferred embodiment headset 23. The two major parts of the headset 23 are an outer set 24 and an inner set 25. The outer set 24 is similar to the ear muff type headsets used at gun ranges. That particular design is intended to muffle the loud crack or sound impulse generated by a discharging gun. The outer set 24 as provided by this preferred embodiment has ear cups 26 (shown in a supplemental side view in FIG. 2) that are circumaural, meaning that the ear cups 26 completely enclose each ear. The ear cups 26 are all plastic and have very soft and comfortable cushions that conform to the side of the patient's head while sealing out external sounds. Also, the headpiece is adjustable and the ear cups 26 are hinged to ensure a proper fit around the patient's skull. In sum, the outer set 24 by virtue of its circumaural design blocks out the gradient knocking noise.

Figure 3:
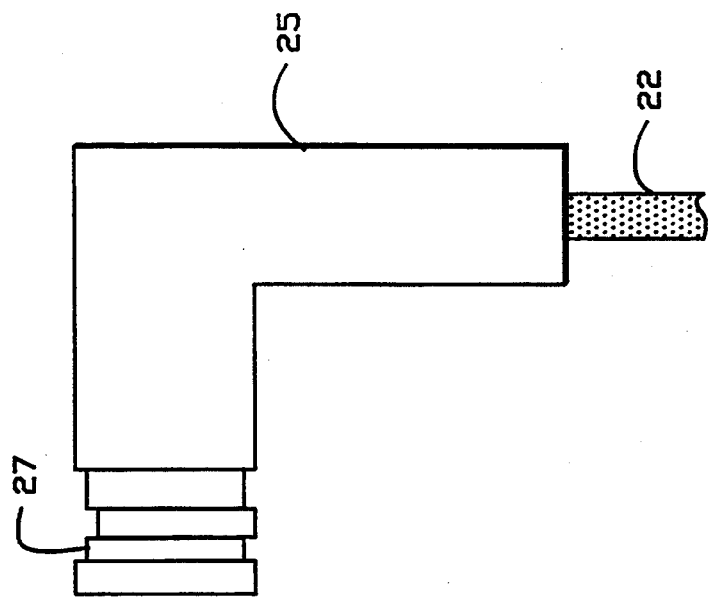
FIG. 3 provides a magnified view of an ear tip component of the inner set.

Disposed inside the outer set 24 is the inner set 25, to which the tubing 22 conducting the sound waves is connected. As shown in FIG. 3, the inner set 25 is configured somewhat like the headsets rented out to passengers by airlines on long distance flights. The basic inner set 25 has an L shape so that its eartip 27 easily hooks into the patient's ear canal while its base connects with the tubing 22. Operating together, the outer set 24 blocks out any gradient knocking noise while the inner set 25 supplies to the patient soothing sounds broadcast from the receiver 3.

In an alternate embodiment, the present invention is modified with an array of magnifying lenses (not shown) disposed adjacent to the LCD display screen. A reflective screen is set up a distance away from the lenses but aligned therewith. In this manner, the pictures on the LCD display screen are projected through the lenses onto the larger reflective screen. In effect, a big screen TV effect can be obtained for easier viewing by the patient.

Many other modifications are possible. For example, a volume control, VCR controls, along with a television channel control could be accessed remotely from the patient's end through a means known in the art. In the same vein, even a panic switch for the patient could be adapted to the system. This way, if the patient has an emergency, he can immediately signal the MRI technologist through a remote controller. One such controller is a handheld infra-red remote controller well known in the art that could be easily adapted by one having ordinary skill in the art to incorporate all of the above-mentioned functions.

In another alternate embodiment, the system may be modified for the patient to be able to see and hear the MRI technologist in the control room via the LCD display screen and headset as the technologist talks to him. This is achieved by mounting a CCD (charge coupled device) camera and a microphone in the control room and using an RF signal interrupt switch in the television, known in the art, to turn the CCD camera and microphone on. The pictures and sounds are then supplied to the patient's LCD display screen and headset in the same manner as described for the preferred embodiment audio and video section signals.

In yet another alternate embodiment, the present invention provides that one cable from the television receiver or VCR located outside the magnet room be passed through the penetration panel. Along with video signal, the cable could carry the power source signal for the television processor/pixel driver circuit and the buffer circuit board. The buffer board and the television processor circuit are both kept in the magnet room inside an RF shielded enclosure, which connects with the incoming cable. An outgoing cable from the shielded enclosure then conducts the signals to the LCD display screen.

An advantage of the foregoing alternate embodiment is that only one filter is required for the video section signal and one filter for the power supply. By contrast, the preferred embodiment requires about twenty filters. Also, it is much easier to install since this embodiment can be adapted to use the RG 58 coaxial cable typically already connected to the penetration panel. No opening has to be cut into the panel to provide access for other cables.

Unfortunately, the buffer board and associated filters for this alternate embodiment might create spurious RF signals that adversely affect the ongoing MRI imaging scan. Indeed, the quality of the patient scan image may be adversely affected by such RF signal leaks.

What is claimed is:

1. An audio and video system compatible with a magnetic resonance imager disposed in a control room and a magnet room separated by a penetration panel, wherein the magnet room contains a main magnet having a bore, the system comprising:

means for receiving an incoming signal and dividing the incoming signal into a video section signal and an audio section signal, located in the control room;

means for buffering and amplifying the video section signal, located in the control room, and connected to the means for receiving;

means for filtering the video section signal for RF and high frequencies, located in the control room, and connected to the means for buffering and amplifying;

a first means for conducting the video section signal, connected to the means for filtering and passing through the penetration panel into the magnet room;

means for terminating and filtering the video section signal, located in the main magnet bore, connected to the first means for conducting;

means for processing and converting the video section signal into a display driving signal, located in the main magnet bore, connected to the means for terminating;

means for displaying the display driving signal, connected to the means for processing, and secured to the main magnet bore by an attachment means;

means for amplifying the audio section signal, located in the control room, connected to the means for receiving;

means for RF filtering and RF choking the audio section signal, located in the control room, connected to the means for amplifying;

a second means for conducting the audio section signal, connected to the means for RF filtering and passing through the penetration panel into the magnet room;

means for converting the audio section signal into audible sound waves, located in the magnet room, connected to the second means for conducting;

a hollow tube, located in the magnet room, connected to the means for converting; and a headset connected to the hollow tube, located in the magnet room, providing an inner set adapted to engage a human ear to conduct audible sound waves thereto and disposed inside an outer set, wherein the outer set is adapted to cover the human ear to block out audible sound.

2. The audio and video system according to claim 1, wherein the means for displaying further comprises means for focussing and projecting an image from the means for displaying onto a projection screen.

3. The audio and video system according to claim 2, wherein the video section signal includes a chroma signal, a control signal and a power source signal.

4. The audio and video system according to claim 3, wherein the means for converting is a pneumatic transducer.

5. The audio and video system according to claim 4, wherein the means for displaying is a liquid crystal display screen.

6. The audio and video system according to claim 5, wherein the pneumatic transducer is a piezoelectric driver.

7. The audio and video system according to claim 6, wherein the first means for conducting is a 25-conductor shielded cable.

8. The audio and video system according to claim 7, wherein the second means for conducting is a 5-pin shielded cable.

9. The audio and video system according to claim 7, wherein the second means for conducting is a coaxial cable.

10. The audio and video system according to claim 7, wherein the liquid crystal display further comprises a fluorescent tube.

11. The audio and video system according to claim 10, wherein the system further comprises means for remotely controlling the means for receiving for volume and channel selection.

12. The audio and video system according to claim 11, wherein the hollow tube is made from a flexible polymer.

13. The audio and video system according to claim 12, wherein the attachment means further comprises a mushroom shaped hook affixed to the liquid crystal display screen, and a catch, mounted to the main magnet bore and adapted to engage the hook.

14. The audio and video system according to claim 13, wherein the means for receiving is a television.

15. The audio and video system according to claim 13, wherein the means for receiving is a video cassette recorder.

16. The audio and video system according to claim 1, wherein the system further comprises a charge coupled device camera and a microphone mounted inside the control room, wherein a video output of the camera and an audio output of the microphone are connected to the means for receiving.

17. An audio and video system compatible with a magnetic resonance imager disposed in a control room and a magnet room separated by a penetration panel, wherein the magnet room contains a main magnet having a bore, the system comprising:

means for receiving an incoming signal and dividing the incoming signal into a video section signal and an audio section signal, located in the control room;

means for buffering and amplifying the video section signal, located in the magnet room and contained within a RF shielded enclosure, and connected to the means for receiving;

means for processing and converting the video section signal into a display driving signal, located in the main magnet bore, connected to the means for buffering;

means for displaying the display driving signal, connected to the means for processing, and secured to the main magnet bore by an attachment means;

means for amplifying the audio section signal, located in the control room, connected to the means for receiving;

means for RF filtering and RF choking the audio section signal, located in the control room, connected to the means for amplifying;

a means for conducting the audio section signal, connected to the means for RF filtering and passing through the penetration panel into the magnet room;

means for converting the audio section signal into audible sound waves, located in the magnet room, connected to the means for conducting;

a hollow tube, located in the magnet room, connected to the means for converting; and a headset connected to the hollow tube, located in the magnet room, providing an inner set adapted to engage a human ear to conduct audible sound waves thereto and disposed inside an outer set, wherein the outer set is adapted to cover the human ear to block out audible sound.

18. A method of producing audio and video signals compatible with a magnetic resonance imager disposed in a control room and a magnet room separated by a penetration panel, wherein the magnet room contains a main magnet having a bore, the method comprising the steps of:

receiving an incoming signal inside the control room;

separating the incoming signal into a video section signal and an audio section signal;

buffering and amplifying the video section signal;

filtering the video section signal;

shielding the video section signal;

passing the video section signal through the penetration panel into the magnet room;

terminating and filtering the video section signal;

processing the video section signal to drive an LCD display screen;

attaching the LCD display screen to the bore;

amplifying the audio section signal;

filtering and choking the audio section signal;

shielding the audio section signal;

passing the audio section signal through the penetration panel into the magnet room;

transducing the audio section signal into an audible sound wave;

conducting the audible sound wave to a headset; and blocking out noise external to the headset.

19. An audio and video system compatible with a magnetic resonance imager disposed in a control room and a magnet room separated by a penetration panel, wherein the magnet room contains a main magnet having a bore, the system comprising:

means for receiving an incoming signal and dividing the incoming signal into a video section signal and an audio section signal, located in the control room;

means for buffering and amplifying the video section signal, connected to the means for receiving;

means for filtering out signals above a first high frequency of the video section signal, connected to the means for buffering;

means for displaying the video section signal, connected to the means for filtering out signals above a first high frequency, located in the magnet room;

means for attaching the means for displaying to the bore;

means for amplifying the audio section signal, connected to the means for receiving, located in the control room;

means for filtering out signals above a second high frequency of the audio section signal, connected to the means for amplifying;

means for converting the audio section signal into an audible sound wave, connected to the means for filtering out signals above a second high frequency, located in the magnet room; and means for conveying the audible sound wave to a patient in the magnet room and for blocking out external noise, connected to the means for converting.

20. The audio and video system according to claim 19, wherein the first high frequency is above 4.5 MHz.

21. The audio and video system according to claim 20, wherein the second high frequency is above 20 kHz.

22. The audio and video system according to claim 21, wherein the system further comprises:

a fiber optics generator, connected to the means for filtering out signals above a first high frequency, located in the control room;

a fiber optics cable connected to the fiber optics generator to conduct the video section signal;

a fiber optics receiver connected to the fiber optics cable, located in the magnet room; and wherein the means for displaying the video section signal is connected to the fiber optics receiver.

23. A video display system for a patient disposed within a magnetic resonance imaging device having a magnetic field, said magnetic resonance imaging device comprising a control room and a magnet room separated by a penetration panel, said magnet room comprising a main magnet having a bore, said video display system comprising:

a magnetically inert display comprising a liquid crystal display (LCD) screen;

said magnetically inert display positioned within the magnetic field of said magnetic resonance imaging device; and a filter preventing electrical signals generated by said magnetically inert display from interfering with said magnetic resonance imaging device.

24. The system of claim 23, further comprising means for preventing electrical signals generated by said magnetic resonance imaging device from interfering with said magnetically inert display.

25. The system of claim 23 or 24, wherein said filter comprises a low pass filter.

26. The system of claim 25, further comprising means for attaching said magnetically inert display to the main magnet bore, said means comprising a mushroom-shaped hook affixed to the LCD screen, and a catch mounted to the main magnet bore and adapted to engage the hook.

27. A video display system for a patient disposed within a magnetic resonance imaging device having a magnetic field, said magnetic resonance imaging device comprising a control room and a magnet room separated by a penetration panel, said magnet room comprising a main magnet having a bore, said video display system comprising:

a magnetically inert display comprising a liquid crystal display (LCD) screen;

said magnetically inert display positioned within the magnetic field of said magnetic resonance imaging device; and means for preventing electrical signals generated by said magnetically inert display from interfering with said magnetic resonance imaging device.

28. The system of claim 27, further comprising means for preventing electrical signals generated by said magnetic resonance imaging device from interfering with said magnetically inert display.

29. The system of claim 27 or 28, wherein at least one of said means for preventing comprises a low pass filter.

30. The system of claim 29, further comprising means for attaching said magnetically inert display to the main magnet bore, said means comprising a mushroom-shaped hook affixed to the LCD screen, and a catch mounted to the main magnet bore and adapted to engage the hook.

31. A video display system for a patient disposed within a magnetic resonance imaging device having a magnetic field, said magnetic resonance imaging device comprising a control room and a magnet room separated by a penetration panel, said magnet room comprising a main magnet having a bore, said video display system comprising:
   a video signal;
   a magnetically inert display comprising a liquid crystal display (LCD) screen;
   said magnetically inert display positioned within the magnetic field of said magnetic resonance imaging device; and
   means for preventing electrical signals generated by said video signal from interfering with said magnetic resonance imaging device.

32. The system of claim 31, further comprising means for preventing electrical signals generated by said magnetic resonance imaging device from interfering with said video signal.

33. The system of claim 32, wherein at least one of said means for preventing comprises a low pass filter.

34. The system of claim 31, 32 or 33, wherein said video signal is supplied to said magnetically inert display through a shielded cable.

35. The system of claim 31, 32 or 33, wherein said video signal is supplied to said magnetically inert display through a fiber optic cable.

36. The system of claim 33, further comprising an amplifier located in the control room, for amplifying the video signal before the video signal is filtered by said filter.

37. The system of claim 36, further comprising means for attaching said magnetically inert display to the main magnet bore, said means comprising a mushroom-shaped hook affixed to the LCD screen, and a catch mounted to the main magnet bore and adapted to engage the hook.

38. The system of claim 32, further comprising a charge coupled device camera and a microphone mounted inside the control room, wherein a video output of the camera supplies said video signal.

39. A video and audio display system for a patient disposed within a magnetic resonance imaging device having a magnetic field, said magnetic resonance imaging device comprising a control room and a magnet room separated by a penetration panel, said magnet room comprising a main magnet having a bore, said video and audio display system comprising:
   an incoming signal comprising a video signal portion and an audio signal portion;
   a video and audio receiver, wherein said receiver divides said incoming signal into a video signal portion and an audio signal portion;
   a magnetically inert display comprising a liquid crystal display (LCD) screen;
   said magnetically inert display positioned within the magnetic field of said magnetic resonance imaging device; and
   means for preventing electrical signals generated by said video signal portion from interfering with said magnetic resonance imaging device.

40. The system of claim 39, further comprising means for preventing electrical signals generated by said magnetic resonance imaging device from interfering with said video signal portion.

41. The system of claim 39, further comprising a filter preventing said audio signal portion from interfering with the magnetic resonance imaging device.

42. The system of claim 41, wherein said filter comprises a low pass filter.

43. The system of claim 39, 40 or 41, wherein said video signal portion is supplied to said magnetically inert display through a shielded cable.

44. The system of claim 39, 40 or 41, wherein said video signal portion is supplied to said magnetically inert display through a fiber optic cable.

45. The system of claim 39, 40 or 41, further comprising a piezoelectric transducer for converting said audio signal portion into audio sound waves.

46. The system of claim 45, further comprising a hollow tube connected to said piezoelectric transducer, and a headset connected to said hollow tube, said headset comprising an inner set portion adapted to engage a human ear to conduct audible sound waves thereto and disposed inside an outer set portion, wherein the outer set portion is adapted to cover the human ear to block out audible sound.

* * * * *

EX PARTE REEXAMINATION CERTIFICATE (4900th)
United States Patent
Ziarati

(10) Number: US 5,412,419 C1
(45) Certificate Issued: Feb. 3, 2004

(54) MAGNETIC RESONANCE IMAGING COMPATIBLE AUDIO AND VIDEO SYSTEM

(75) Inventor: Mokhtar Ziarati, Calabasas, CA (US)

(73) Assignee: Resonance Technology, Inc., Van Nuys, CA (US)

Reexamination Request:
No. 90/004,833, Nov. 12, 1997

Reexamination Certificate for:
Patent No.: 5,412,419
Issued: May 2, 1995
Appl. No.: 07/653,711
Filed: Feb. 11, 1991

(51) Int. Cl.[7] ............................................. H04N 7/18
(52) U.S. Cl. ........................... 348/61; 348/77; 324/318; 600/418
(58) Field of Search ........................ 348/61, 77, 162; 324/318, 300, 307, 308, 309, 319; 128/653.3, 653.2; H04N 7/18

(56) References Cited

U.S. PATENT DOCUMENTS

| | | | |
|---|---|---|---|
| 4,299,303 A | * 11/1981 | Clark | 181/131 |
| 4,347,911 A | 9/1982 | Bertagna et al. | |
| 4,595,260 A | 6/1986 | Kubota | |
| 4,613,820 A | 9/1986 | Edelstein | 324/318 |
| 4,701,952 A | 10/1987 | Taylor | 381/25 |
| 4,824,210 A | 4/1989 | Shimazaki | |
| 4,861,142 A | 8/1989 | Tanaka et al. | |
| 4,864,192 A | 9/1989 | Buchwald et al. | |
| 4,901,141 A | 2/1990 | Costello | |
| 4,903,703 A | 2/1990 | Igarashi et al. | |
| 4,928,123 A | 5/1990 | Takafuji | |

(List continued on next page.)

FOREIGN PATENT DOCUMENTS

| | | | |
|---|---|---|---|
| DE | 37 08 518 | 9/1988 | |
| DE | 38 44 482 | 2/1990 | |
| EP | 01 57 404 | 10/1985 | |
| WO | WO 90/07301 | 12/1990 | A61B/5/055 |

OTHER PUBLICATIONS

Transcript of Aug. 11, 1997 Hearing in *Resonance Technology, Inc. v Siemens Medical Systems, Inc.*, No. CV–97–0788–GHK (C.D. Cal.).

(List continued on next page.)

*Primary Examiner*—M. Lee

(57) ABSTRACT

An audio and video system that is compatible with the strong magnetic fields generated by Magnetic Resonance Imaging equipment (wherein the MRI equipment is separated by a penetration panel into a control room and a magnet room). The system receives an incoming RF signal through a television or video cassette recorder, and then separates the RF signal into a video section signal and an audio section signal. The video section signal passes through appropriate buffering, amplifying, low pass (for the procession frequency) and RF filtering circuits, and is next conducted through the penetration panel into the magnet room where it is terminated and filtered again for spurious noise. A processor and LCD pixel driver then process the video section signal and send it to an LCD display screen. A mushroom shaped hook is mounted to the screen and a catch is mounted to a bore of a main magnet inside the magnet room so that the LCD screen can be attached to the bore. The audio section signal is separated into two channels, passed through an amplifier and appropriate RF filters and chokes, and fed into a pneumatic transducer inside the magnet room. A headset having an inner set connects the output of the pneumatic transducer to the patient's ear, while an outer set covers the patient's ear to block out gradient knocking noises. In an alternate embodiment, a CCD camera is mounted inside the control room along with a microphone so that pictures and sounds from the MRI technologist can be broadcast through the present system to allow the patient to see and hear the technologist speaking. Fiber optics technology may also be incorporated into the signal conducted cables provided under this invention.

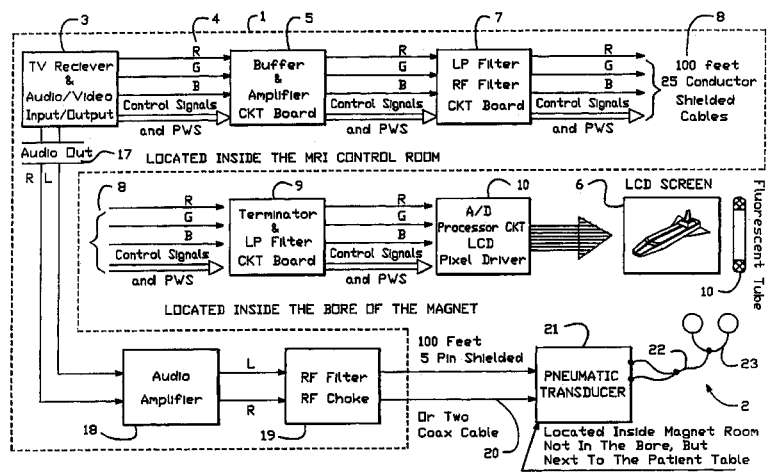

U.S. PATENT DOCUMENTS

| | | | |
|---|---|---|---|
| 4,933,981 | A | 6/1990 | Lederer |
| 4,972,836 | A | 11/1990 | Schenck et al. |
| 4,981,137 | A | 1/1991 | Kondo et al. |
| 4,991,580 | A | 2/1991 | Moore |
| 4,991,587 | A | 2/1991 | Blakely et al. |
| 5,038,785 | A | 8/1991 | Blakely et al. |
| 5,076,275 | A | 12/1991 | Bechor et al. |
| 5,101,139 | A | 3/1992 | Lechter |
| 5,184,074 | A | 2/1993 | Arakawa et al. |

OTHER PUBLICATIONS

S.J. Karlik et al., "Patient Anesthesia and Monitoring at a 1.5–T MRI Installation," 7 Magnetic Resonance in Med. at 210–221 (1988).

Rokey et al., "Monitoring of Acutely Ill Patients During Nuclear Magnetic Resonance Imaging: Using a Time Varying Filler Electrocardiographic Gating Device to Reduce Gradient Artifact," 6 Magnetic Resonance in Med. at 240–245 (1988).

Gerald E. Jones, "DMM Protection Features," *Computer/Electronic News Service,* Jun., 1985.

Allan Stephan, "Digital Multimeter Packaging Tackles Harsh Environment," Electronic Packaging and Production, Oct. 1984.

Tak Tsang, "Fluke 25/27 and 8025A: The Best in EMI Shielding;" 1085 Fluke Scoop, Oct. 1985.

Stephen A. Magnus, "When High–end Instruments will Shun CRTs; Flat–panel Displays," EDN (Sep. 7, 1989).

Peter McAtamney and Derek Shaw, "Siting and Installation," Chapter 2 of *Practical NMR Imaging,* pp. 49–79 (1987).

Invivo Research Inc. MRI Vital Signs Monitoring Product Line, 1988.

Declaration of Mokhtar Ziarati of Apr. 28, 1994 submitted in *Magnacoustics, Inc. v. Resonance Technology Co. et al.,* Case No. CV–93–1052–JSL (Ex).

Deposition of Mokhtar Ziarati, Jun. 4, 1997 *Resonance Technology, Inc. v. Siemens Medical Systems, Inc.,* No. 97–0788 GHK (CTx).

Declaration of John Villasenor, Jul. 14, 1997, *Resonance Technology, Inc. v. Siemens Medical Systems, Inc.,* No. 97–0788 GHK (CTx).

Deposition of John David Villasenor, Jun. 6, 1997 *Resonance Technology, Inc. v. Siemens Medical Systems, Inc.* No. 97–0788 (GHK) (C.Tx.).

AAPM, Site Planning for Magnetic Resonance Imaging Systems, Dec. 1986.

Michael R. Lindeburg, Engineer–In–Training Reference Manual, p. 48–13, 1990.

Declaration of Mokhtar Ziarati dated Aug. 29, 1991, Ser. No. 07/653,711.

Einstein and Hilal, "Site Planning and Design: Influences and Implementation," *Magnetic Resonance Annual,* p. 307–08, 1985.

McArdle, "MRI helps detect injury in neonatal, infant brain," *Diagnostic Imaging,* 1987.

White, "A Handbook on EMI Control Methods and Techniques," Chapters 11 and 12, 1973.

White, "Shielding Design—Methodology and Procedures," Chapter 4, "Aperture Leakages and Their Control," Chapters 6, 12, 1986.

Notice of Prior Art Pursuan to 35 U.S.C. Section 282 filed in Case No. CV–97–0788–GHK (Ctx), dated Feb. 19, 1998.

Declaration of Donald R. J. White filed in Case No. CV–97–0788–GHK (CTx), 1997.

Declaration of Ronald E. Susi filed in Case No. CV–97–0788–GHK (CTx) (including alleged materials from Invivo Research), 1997.

Second Declaration of Donald R. J. White filed in Case No. CV–97–0788–GHK (CTx), 1997.

Declaration of Mokhtar Ziarati filed in Case No. C–93–1052–JSL (Ex).

Declaration of John Villasenor, dated Apr. 10, 1997, filed in Case No. CV–97–0788–GHK (CTx).

Declaration of John Villasenor, dated Jul. 14, 1997, filed in Case No. CV–97–0788–GHK (CTx).

Expert report of Barry E. Bretschneider filed in Case No. CV–97–0788–GHK (CTx).

Expert report of Donald R. J. White filed in Case No. CV–97–0788–GHK (CTx).

Deposition of Barry E. Bretschneider in Case No. CV–97–0788–GHK (CTx).

\* cited by examiner

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 1–22, 26, 30, 34, 37 and 39–46 is confirmed.

Claims 23–25, 27–29, 31–33, 35, 36 and 38 are cancelled.

\* \* \* \* \*